(12) United States Patent
Drake et al.

(10) Patent No.: US 6,366,395 B1
(45) Date of Patent: Apr. 2, 2002

(54) OPTICAL AMPLIFIER GAIN CONTROL

(75) Inventors: Jonathan Drake; Barrie Flintham, both of Paignton; Graeme A Henderson, Plymouth, all of (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/539,124

(22) Filed: Mar. 30, 2000

(51) Int. Cl.[7] .................................................. H01S 3/00
(52) U.S. Cl. ................... 359/341.41; 359/337
(58) Field of Search ................................ 359/194, 337, 359/337.1, 337.11, 337.12, 337.13, 337.2, 337.21, 337.22, 337.3, 337.4, 337.5, 341.1, 341.2, 341.3, 341.31, 341.32, 341.33, 341.4, 341.41, 341.42, 341.43, 341.44, 341.5; 372/38.01, 38.02, 38.06, 6, 34

(56) References Cited

U.S. PATENT DOCUMENTS 6,246,510 B1 * 6/2001 BuAbbub et al. ........... 359/337

OTHER PUBLICATIONS

Nakagawa et al., "1580–nm Band Erbium–Doped Fiber Employing Novel Temperature Compensation Technique", Optical Fiber Communications Conference 2000, Mar. 7–10, 2000, vol. 2, pp. 108–110.*

* cited by examiner

Primary Examiner—Thomas H. Tarcza
Assistant Examiner—Deandra M. Hughes
(74) Attorney, Agent, or Firm—Lee, Mann, Smith, McWilliams Sweeney & Ohlson

(57) ABSTRACT

An optical amplifier comprises a pumped doped fiber with a power measurement circuit for measuring the input and output power of the amplifier. Automatic gain control is implemented, and the calculation of output power for the AGC loop takes into consideration the temperature provided by a temperature measurement device. This enables a flatter gain response to be achieved over varying input power, which enables an increase in the dynamic range of the amplifier and thereby a possible increase in system capacity of a WDM system using the amplifier.

8 Claims, 3 Drawing Sheets

OPTICAL AMPLIFIER GAIN CONTROL

FIELD OF THE INVENTION

This invention relates to optical communications systems and, more particularly, a gain control system for optical amplifiers for use in such systems.

BACKGROUND OF THE INVENTION

Large capacity optical transmission systems typically combine high speed signals on a signal fiber by means of Wavelength Division Multiplexing (WDM) to fill the available bandwidth. In these WDM optical transmission systems, in general, rare-earth doped fiber optical amplifiers (such as Erbium or Erbium-Ytterbium doped) are used to compensate for the fiber link and splitting losses.

Doped fiber amplifiers can provide of low noise and high gain, but they do suffer from various distortions.

As one example, gain tilt is the measure of the slope of the wavelength dependent gain of a fiber amplifier. It arises because the gain of an Erbium-doped amplifier is inherently dependent upon the absorption and emission wavelength spectrum of the Erbium ions in the fiber. One effect of gain tilt on an optical signal being amplified is an amplitude modulation of the optical signal (an unwanted distortion) by any wavelength variation in the optical signal. As a result of gain tilt, an amplifier will not provide uniform gain for different channels of a WDM system. It is known to provide dielectric filtering elements with the amplifier, and these can reduce gain tilt for a specific gain setting of the amplifier.

Gain transients, where step changes in the amplifier gain are caused by variations in input signals, are also a major problem for WDM optical systems. Gain transients occur because channels are added or dropped either due to network reconfiguration or failures. Adding channels can depress the power of the present channels below the receiver sensitivity. Dropping channels can give rise to error events in the surviving channels because the power of the surviving channels can surpass the thresholds for non-linear effects. The error bursts in the surviving or present channels as a result of these power transients are unacceptable to service providers.

Some of these effects can be eliminated if the amplifier gain, and hence gain spectrum, is controlled independently of input signal level. In this way, a constant gain can be maintained regardless of the number of channels present at the input. This requires rapid gain control to respond to channel adding and dropping at the input, without giving rise to large or prolonged gain transient effects. Known systems for implementing independent amplifier gain control use automatic gain control (AGC) in the form of opto-electronic or all optical feedback loops.

AGC schemes may use feed-forward or feedback loops, or a combination of these, in order to derive control signals from measures of input and output powers so as to increase the amplifier pump power when more output power is required. Typically, an error signal is generated which represents the difference between a desired output power level and the actual output power level, with the desired output power level being calculated from the measured input power taking into consideration the desired constant gain of the amplifier.

The calculation of the desired output power essentially involves multiplying the input power by the desired gain and adding a compensation factor for amplified stimulated emission (ASE). This ASE contributes to the measured output power of the amplifier, but is not representative of the gain imparted onto the optical signal. Clearly any error in the ASE compensation factor gives rise to errors in the desired output power, so that the gain control loop fails to achieve the desired signal amplification.

The invention is based on the recognition that the ASE component of the output power is temperature dependent, and furthermore is temperature dependent in a predictable manner.

SUMMARY OF THE INVENTION

According to the invention, there is provided an optical amplifier comprising:

a doped fiber;

a pump source for providing pump light to the fiber;

a power measurement circuit for measuring the input and output power of the amplifier;

a driver circuit for controlling the pump source, the power measurement circuit and the driver circuit comprising an amplifier gain control loop, the driver circuit estimating a desired output power based on the measured input power and a desired gain to be provided by the amplifier, wherein a temperature measurement device is provided, and wherein the estimation of the desired output power takes into consideration the temperature provided by the temperature measurement device.

The invention provides a gain control scheme in which a measured input power is used to calculate a desired output power taking into consideration the gain setting of the amplifier and the temperature conditions. This enables a flatter gain response to be achieved over varying input power, which enables an increase in the dynamic range of the amplifier and thereby a possible increase in system capacity of a WDM system using the amplifier.

Preferably, the doped fibre comprises an Erbium doped optical fiber and the pump source comprises a laser diode, and wherein the driver circuit provides a laser diode drive current.

The input and output power are preferably supplied to a processor which generates control signals for controlling the driver circuit. In particular, an error signal may be derived from the estimated output power and the measured output power, which is processed using a proportional and integral controller, and the measured input power is processed using a differential controller.

The amplifier is for use in an optical transmission system comprising an optical transmitter and an optical receiver, with an optical fiber link between transmitter and the receiver comprising one or more amplifiers of the invention.

The invention also provides a method of controlling an optical amplifier comprising a doped fiber and a pump source for providing pump light to the fiber, the method comprising:

measuring the power at the input and output of the amplifier;

estimating a desired output power based on the measured input power and a desired gain to be provided by the amplifier;

controlling the pump source to achieve the desired gain by processing a signal derived from the measured output power and the estimated desired output power, wherein the estimation of the desired output power takes into consideration a temperature provided by a temperature measurement device.

BRIEF DESCRIPTION OF THE DRAWINGS

An example of the invention will now be described in detail with reference to the accompanying drawings, in which.

DETAILED DESCRIPTION

Figure 1:
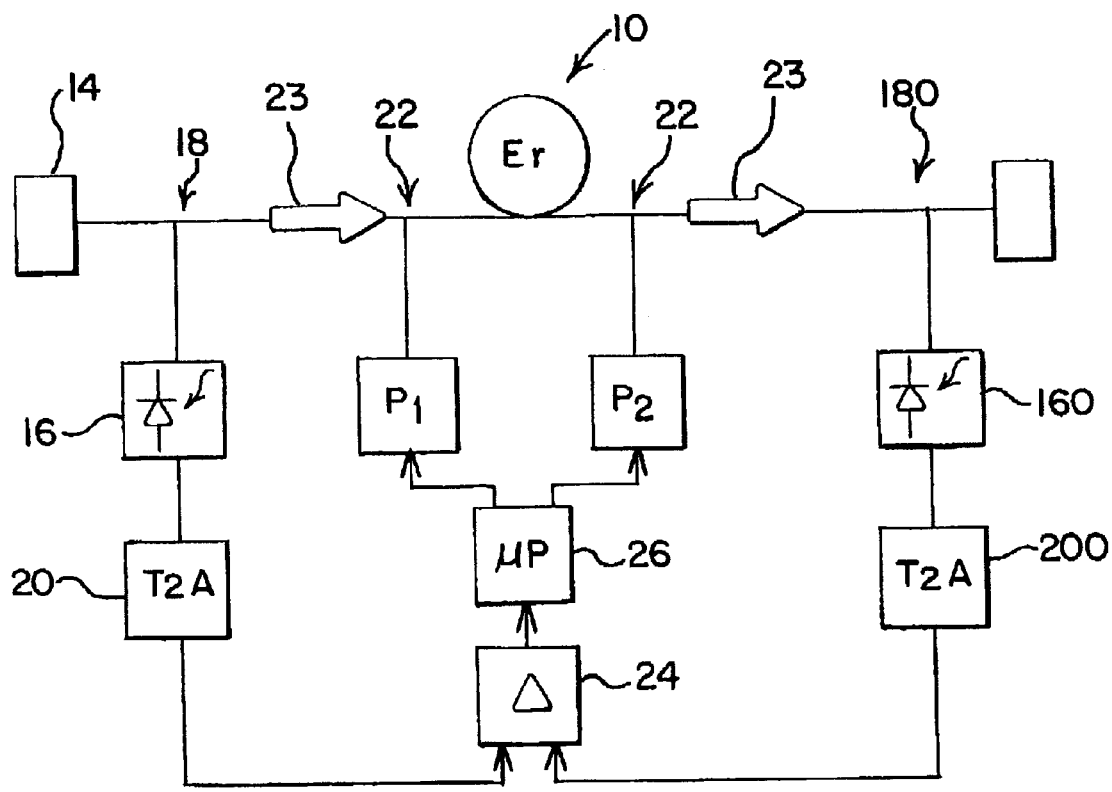
FIG. 1 shows a conventional Erbium doped fibre amplifier (EDFA) with automatic gain control.

FIG. 1 shows a known erbium doped fiber amplifier with automatic gain control. The amplifier comprises an erbium-doped fiber 10. An input to the amplifier 14 normally comprises a plurality of wavelength division multiplexed channels. The input power applied to the amplifier is measured using a photo detector 16 which receives a proportion of the input signal which is tapped off the main input line using a tap coupler 18. The photodiode 16 is responsive to the duration and intensity of optical pulses at the input and generates an output current. This is converted by a transimpedance amplifier 20 into a voltage representing the power of the optical pulses at the input. A similar power measurement circuit is provided at the output of the amplifier, again comprising a photodiode 160, a tap coupler 180 and a transimpedance amplifier 200.

In the example shown in FIG. 1, the amplifier 10 is co-pumped and counter-pumped, by pump sources $P_1$ and $P_2$, respectively. The pump light is generated by laser diodes, at a number of possible wavelengths, for example 980 nm or 1480 nm. For example, the co-pump source $P_1$ may comprise a 980 nm laser diode, whereas the counter-pump source $P_2$ may comprise a 1480 nm laser diode.

In each case, the pump power is introduced to the optical fiber line using a fused fiber wavelength division multiplexer 22. Optical isolators 23 are provided at the input and output of the amilifier. The isolators prevent the passage of backward-propagating ASE which could be reflected back into the fiber, increasing the noise level.

The measured input and output powers are supplied to a circuit 24 for deriving an error signal. This circuit 24 calculates a target output power based on the measured input power and the desired gain of the amplifier. Essentially, the input power is multiplied by the desired gain, and an ASE compensation factor is added. This gives the output power which is required to achieve the desired level of signal gain. The purpose of the amplifier control system is to maintain a substantially constant gain.

The circuit 24 derives an error between the target output power and the measured output power, and this error signal is used to control the pump sources $P_1$ and $P_2$ to alter the amplifier pumping conditions to achieve the required gain.

Changes in the pumping conditions may be required in response to changes in the input signal, for example in response to the adding or dropping of WDM channels. The error signal is supplied to a processor 26 which calculates a target pump level for the system, this target pump level being used to drive the three laser diode pump sources $P_1$ and $P_2$.

The calculation of the desired output power takes into consideration the gain setting of the amplifier and also compensates for forward-propagating ASE. The ASE characteristics of the amplifier vary depending upon the gain setting, and also in dependence upon prevailing temperature conditions.

Figure 2:
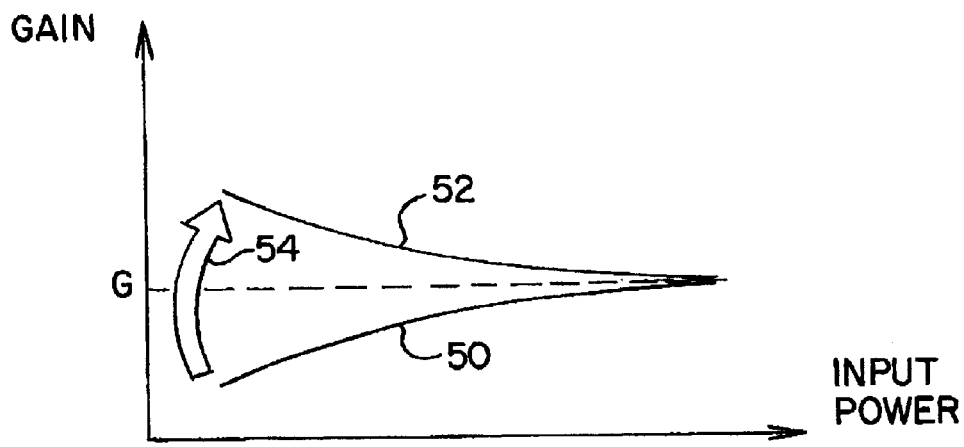
FIG. 2 shows schematically the relationship between the output power of an EDFA and the temperature.

FIG. 2 shows schematically how temperature variations can influence the amplifier gain when the calculation of target output power is independent of temperature. In FIG. 2, the level of gain G represents the gain setting of the amplifier, and is the gain which the automatic gain control loop is calibrated to achieve. For high input power signals the control loop achieves the desired gain. However, for lower input powers there is an increased dependence upon temperature. Plot 50 corresponds to a low temperature analysis of the amplifier performance, and shows that for low input powers the incorrect compensation for forward-propagating ASE in the calculation of the target output power results in the actual gain of the amplifier falling short of the intended constant gain. For the high temperature plot 52, the gain of the amplifier exceeds the desired constant value. Arrow 54 indicates the progression of the gain versus power plot for increasing temperature.

There are a number of factors which contribute to the error in the automatic gain control loop which arises as a result of temperature fluctuations. One example is the temperature dependency of the photodiode power measurement circuitry and of the optical tapping unit. A further example is the dependency of noise power distribution within the erbium upon temperature.

Figure 3:
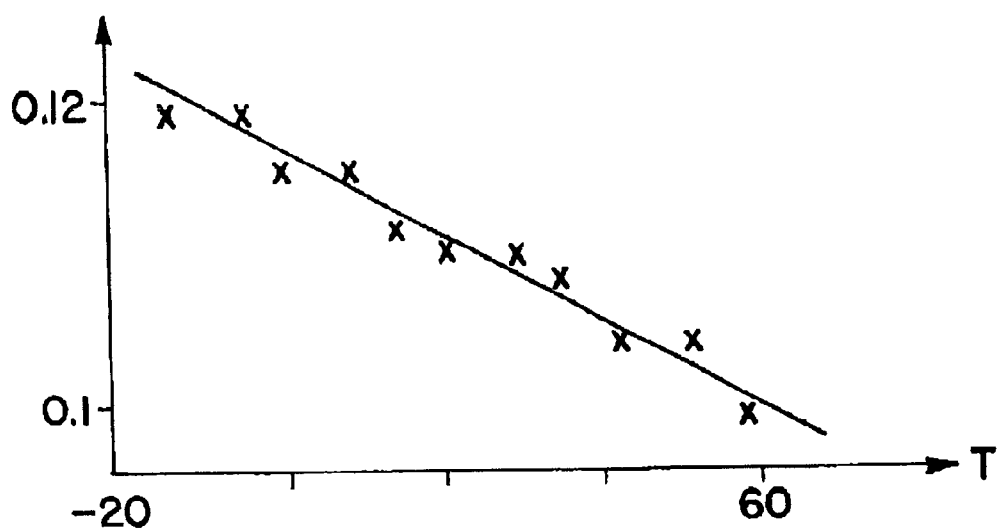
FIG. 3 shows schematically the modification required to the ASE compensation factor in the calculation of target output power to compensate for temperature.

The inventors have calculated the change in the ASE compensation factor which is required to compensate for the temperature variations. FIG. 3 shows the ASE factor required in the calculation of the target output power as a function of temperature which is required so that the automatic gain control loop provides constant gain operation. As shown in FIG. 3, it has been found that the dependence of the required ASE factor on temperature is substantially linear, so that the temperature dependence of the ASE factor can be modelled by a linear equation.

The relationship of the required ASE factor with temperature varies as a function of the gain setting of the amplifier, and the plot given in FIG. 3 is for one particular gain setting.

Figure 4:
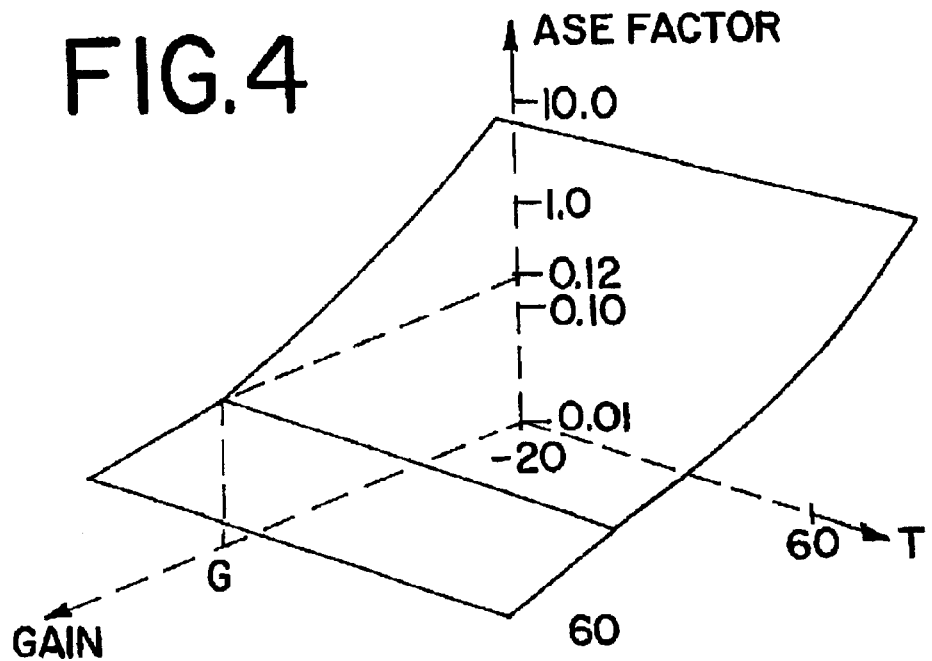
FIG. 4 shows schematically the modification required to the ASE compensation factor in the calculation of target output power to compensate for temperature and taking into account the gain setting of the amplifier.

FIG. 4 shows a three-axis plot of the required ASE factor versus temperature, and showing the dependence of this plot on the gain setting of the amplifier. Line 60 in FIG. 4 corresponds to the plot of FIG. 3 at the particular gain setting G. The dependence of the required ASE factor on the gain setting of the amplifier is also substantially linear, so that the three-dimensional surface of FIG. 4 may be approximated as a plane (aX+bY+cZ=k).

Figure 5:
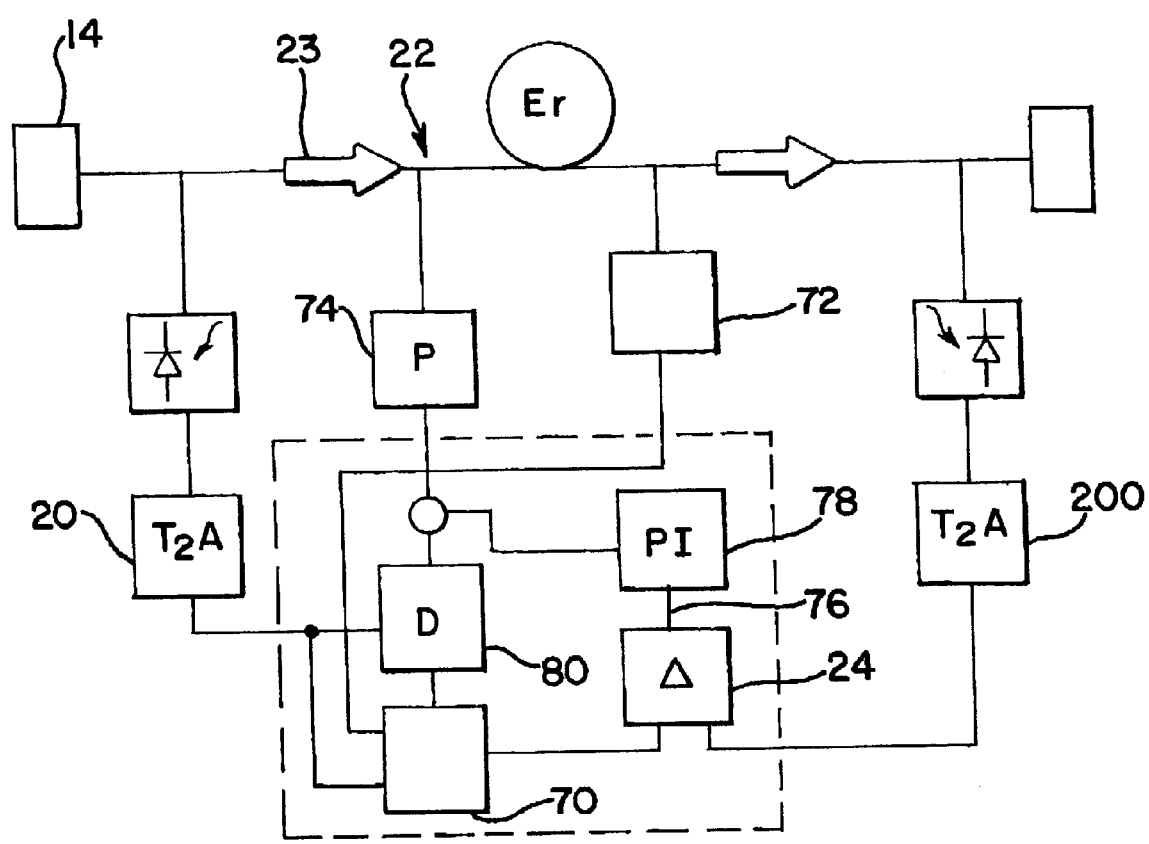
FIG. 5 shows an EDFA with automatic gain control according to the invention.

FIG. 5 shows an optical amplifier with automatic gain control with temperature compensation of the invention. Where the same components appear as in FIG. 1, the same reference number has been used. For simplicity, a single pump 74 is shown in FIG. 5.

The input power measured by the amplifier 20 is supplied to a unit 70 for calculating the desired output power. This unit 70 implements the equation:

$$P_{OUT} = P_{IN} \times G + F_{ASE}$$

where $F_{ASE}$ is the forward-propagating ASE compensation factor, and where G is the gain setting of the amplifier. The amplifier will normally be manufactured for a specific gain setting, although it is equally possible for a desired gain setting to be provided as an input to the unit 70. The ASE compensation factor, which is used by the unit 70 for calculating the target output power, is temperature dependent in the manner described with reference to FIGS. 3 and 4. If the amplifier is calibrated for only one gain setting, then the unit 70 needs to implement only the linear function described with reference to FIG. 3. If the amplifier is to allow compensation for any gain setting, then the unit 70 implements compensation using the surface represented in FIG. 4.

In each case, the operating temperature of the fiber amplifier is provided by a temperature measurement device 72. The desired or target output power calculated by the unit 70 is provided to the error calculation circuit 24 which calculates the error between the target output power and the measured output power from the amplifier 200. This error signal is then processed to derive the pump control signal for the laser diode pump source 74.

As shown in FIG. 5, the processing applied to the error signal 76 is proportional and integral control (PI), to provide the desired control signal for the pump source so that the amplifier can respond rapidly to a required change in pump power. The proportional and integral controller 78 defines a feedback control loop, and the temporal response of the feedback loop is preferably matched to the open loop gain of the amplifier so that the feedback control is appropriately damped. The feedback control should be stable, so that oscillations are avoided, but also should not be over-damped which prolongs the response time of the amplifier control loop to required changes in pump power.

The input power from the amplifier 20 is provided to a derivative controller 80. This controller 80 defines a feed-forward control loop, and carries out a transient suppression function, whereby step changes in the input power (for example resulting from the adding or dropping of WDM channels) are detected as rapidly as possible and give rise to an immediate pump power adjustment, to reduce the possibility of power surges at the output of the amplifier.

The pump source control signal from the derivative controller 80 and the proportional and integral controller 78 are combined to form the control signal for the laser diode pump 74.

The temperature compensation carried out in unit 70 may be implemented as an algorithm within a digital signal processor, which algorithm models the functions represented in FIGS. 3 and 4. Alternatively, the data of FIGS. 3 and 4 may be stored in a look-up table which is accessed by a microprocessor when calculating the target desired output power.

The invention enables deviation from the amplifier gain setting to be reduced significantly. This deviation gives rise to gain tilt which limits the dynamic range of operation of the amplifier. In WDM systems, the dynamic range governs the possible number of WDM channels which can be supported, and therefore the overall system capacity.

The invention has been described with reference to a single-stage optical amplifier. However, the AGC control scheme of the invention may be applied to multiple stages within an amplifier. Furthermore, the control scheme may be used to derive pump control signals for a single-pump system or a co-and counter-pumped system, such as shown in FIG. 1. There are various ways in which the laser diode pumps may be controlled, and there are also various ways in which the characteristics of the gain control loop may be varied. The invention has been described in detail in connection with one particular gain control loop, shown in FIG. 5. However, it will be appreciated by those skilled in the art that the invention relates specifically to the calculation of a desired output power level which takes into account the temperature conditions. This temperature-corrected target output power level may be used in any automatic gain control system to improve the resilience of the gain control loop to temperature variations.

The dependence of the desired ASE factor with temperature will vary for different amplifier configurations, and the dependence of the forward-propagating ASE in any specific amplifier will be obtained by experiment. The results of this initial experiment will then be used to determine the nature of the graphs shown in FIGS. 3 and 4 which are then used to determine the operation of the unit 70.

We claim:

1. An optical amplifier comprising:

a doped fiber;

a pump source for providing pump light to the fiber;

a power measurement circuit for measuring the input and output power of the amplifier;

a driver circuit for controlling the pump source, the power measurement circuit and the driver circuit comprising an amplifier gain control loop, the driver circuit estimating a desired output power based on the measured input power and a desired gain to be provided by the amplifier, wherein a temperature measurement device is provided, and wherein the estimation of the desired output power takes into consideration the temperature provided by the temperature measurement device.

2. An amplifier according to claim 1, wherein the doped fibre comprises an Erbium doped optical fiber.

3. An amplifier according to claim 1, wherein the pump source comprises a laser diode, and wherein the driver circuit provides a laser diode drive current.

4. An amplifier according to claim 1, wherein the input and output power are supplied to a processor which generates control signals for controlling the driver circuit.

5. An amplifier according to claim 4, wherein an error signal derived from the estimated output power and the measured output power is processed using a proportional and integral controller, and the measured input power is processed using a differential controller.

6. An optical transmission system comprising an optical transmitter and an optical receiver, and an optical fiber link between transmitter and the receiver, wherein the optical link comprises one or more amplifiers according to claim 1.

7. A method of controlling an optical amplifier comprising a doped fiber and a pump source for providing pump light to the fiber, the method comprising:

measuring the power at the input and output of the amplifier;

estimating a desired output power based on the measured input power and a desired gain to be provided by the amplifier;

controlling the pump source to achieve the desired gain by processing a signal derived from the measured output power and the estimated desired output power, wherein the estimation of the desired output power takes into consideration a temperature provided by a temperature measurement device.

8. A storage medium containing computer executable instructions for processing two inputs representing a measured input and a measured output power of an optical amplifier, and a temperature input, the instructions implementing a method comprising the steps of:

multiplying the measured input power by the gain setting of the amplifier to obtain a first output power;

determining an ASE compensation factor based on the temperature signal and the gain setting;

adding the ASE compensation factor to the first output power to obtain a desired output power;

comparing the desired output power with the measured output power and deriving a control signal from the comparison.

* * * * *